United States Patent [19]

Mesquida et al.

[11] Patent Number: 5,012,477
[45] Date of Patent: Apr. 30, 1991

[54] OPTOELECTRONIC POWER DEVICE AND FABRICATION METHOD THEREOF

[75] Inventors: Guy Mesquida, Forges les Bains; Bernard Groussin, Orsay, both of France

[73] Assignee: Thomson Composants Microondes, Puteaux, France

[21] Appl. No.: 435,986

[22] Filed: Nov. 13, 1989

[30] Foreign Application Priority Data

Nov. 15, 1988 [FR] France .................. 88 14799

[51] Int. Cl.$^5$ .................................. H01S 3/19
[52] U.S. Cl. ........................ 372/50; 372/45; 372/108; 350/96.11
[58] Field of Search .............. 372/50, 48, 46, 44, 372/45, 99; 350/96.11

[56] References Cited

U.S. PATENT DOCUMENTS

| | | | |
|---|---|---|---|
| 4,633,476 | 12/1986 | Scifres et al. | 372/45 |
| 4,718,070 | 1/1988 | Liau et al. | 372/50 |
| 4,719,635 | 1/1988 | Yeh | 372/50 |
| 4,807,238 | 2/1989 | Yokomori | 372/32 |

Primary Examiner—Frank Gonzalez
Assistant Examiner—Galen J. Hansen
Attorney, Agent, or Firm—Oblon, Spivak, McClelland, Maier, & Neustadt

[57] ABSTRACT

The disclosure concerns an integrated circuit which forms an electronic power device. This integrated circuit has, supported by a substrate, at least one array of lasers and at least one flat bar of reflectors. The reflectors send back the laser beams, emitted parallel to the substrate, perpendicularly to the substrate. The cleaved faces of the lasers are obtained by the sub-etching of the arrays, then through breaking by ultrasound.

8 Claims, 3 Drawing Sheets

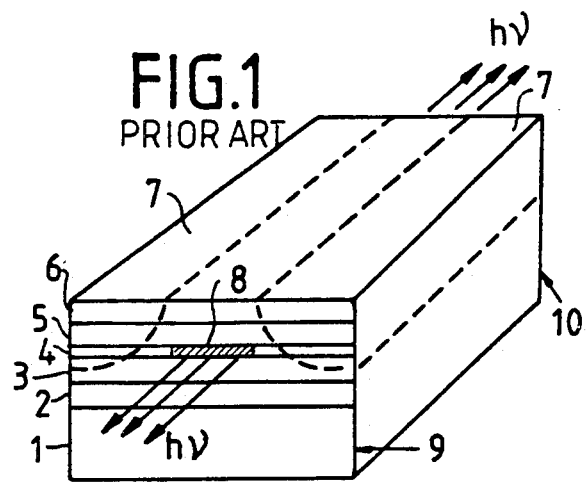
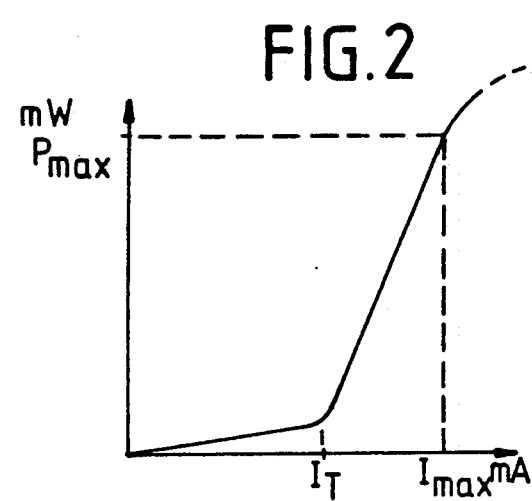
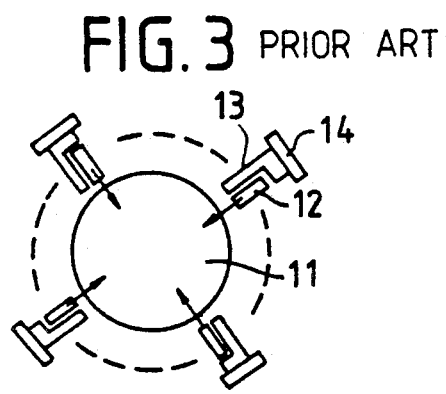
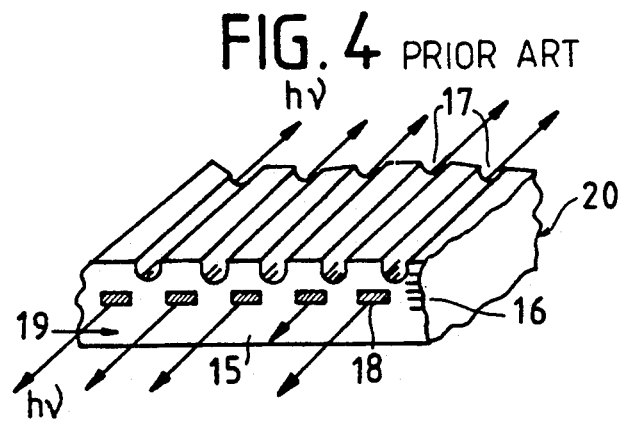
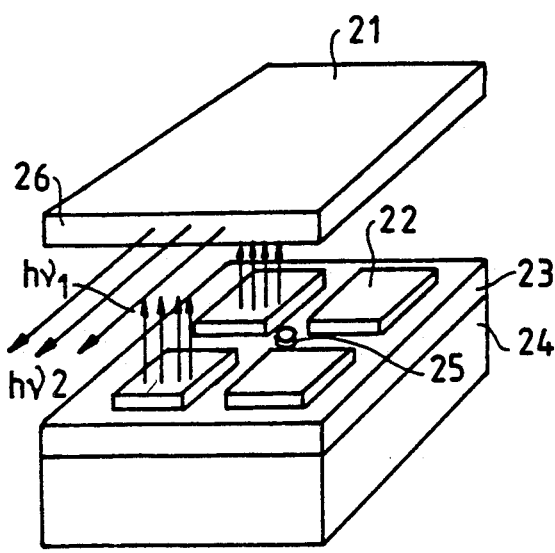
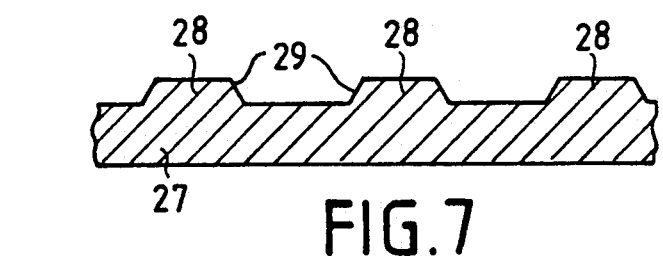
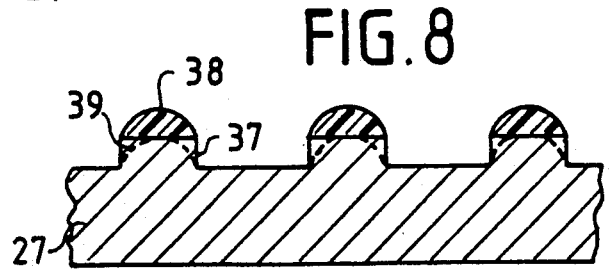

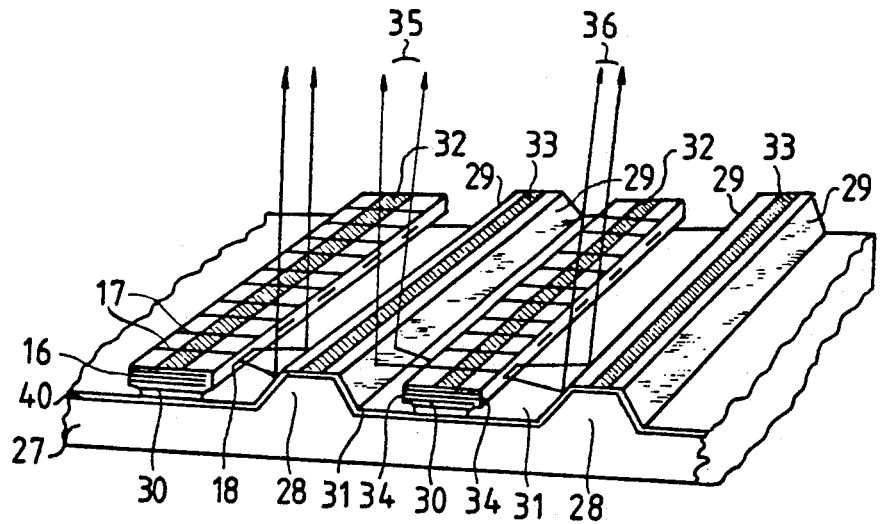
FIG. 6
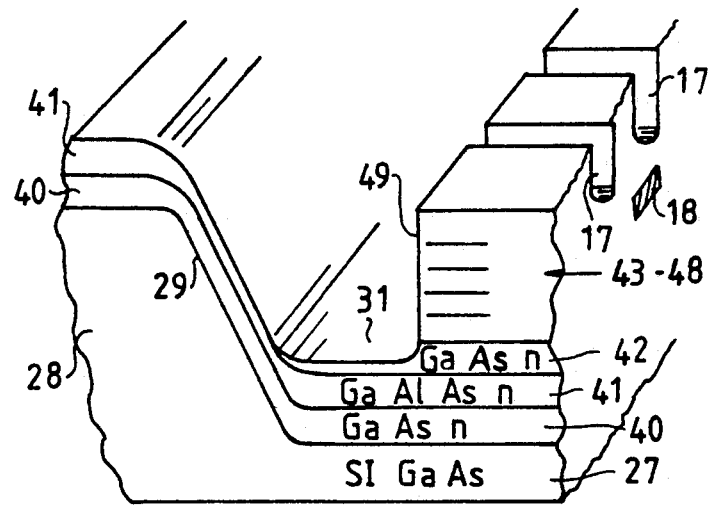
FIG. 9
FIG. 10
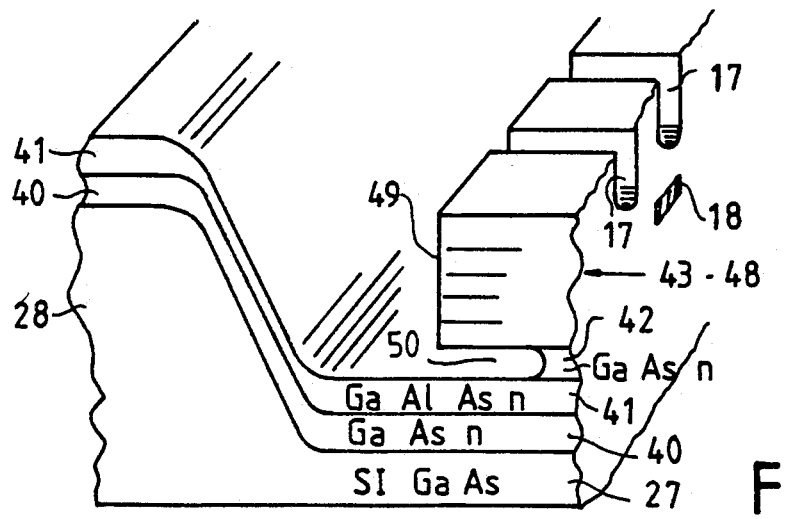
FIG. 11

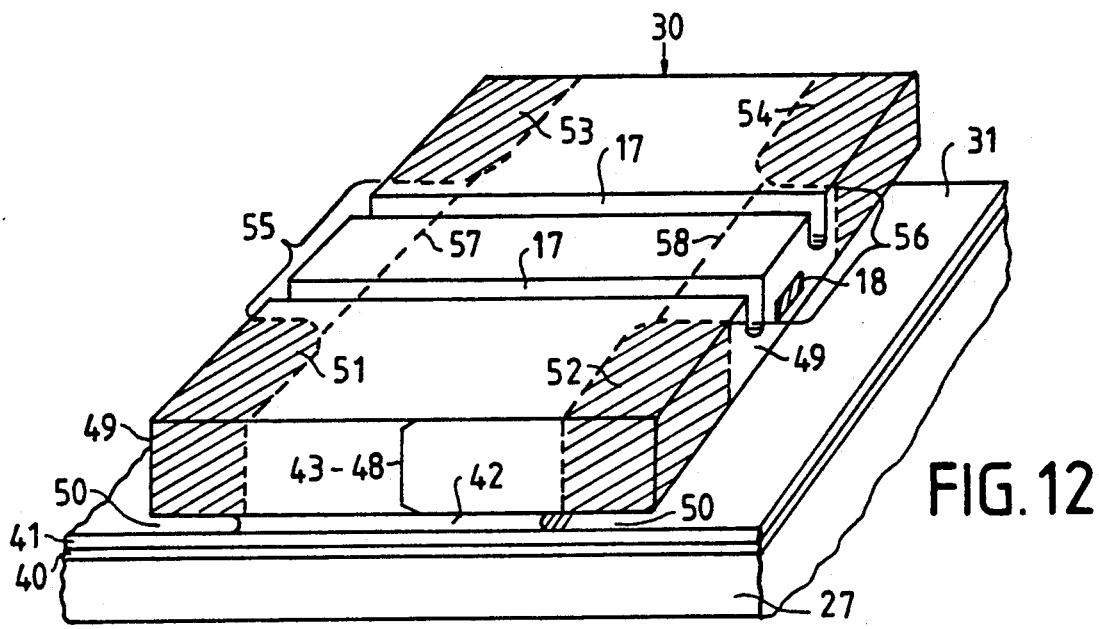
FIG. 12
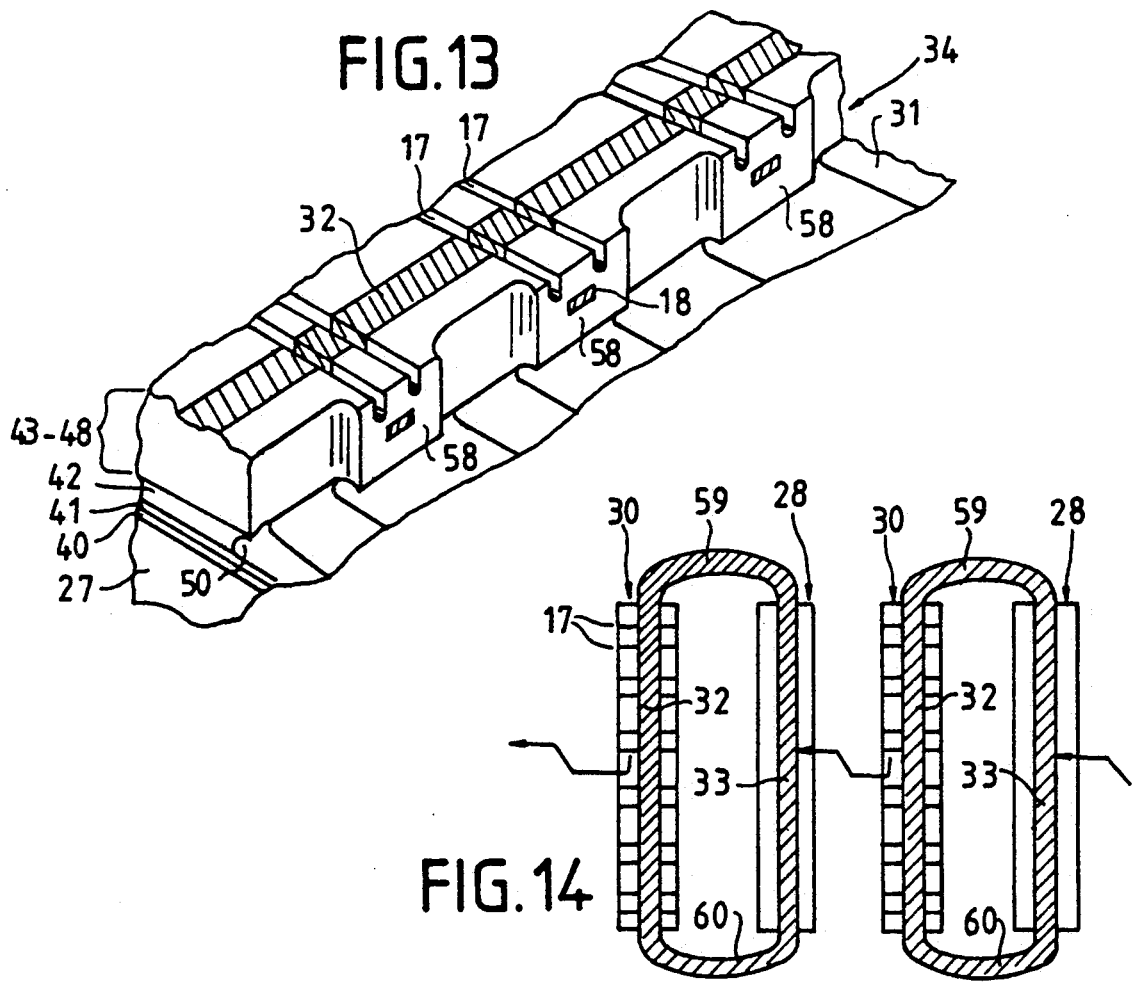
FIG. 13
FIG. 14

OPTOELECTRONIC POWER DEVICE AND FABRICATION METHOD THEREOF

BACKGROUND OF THE INVENTION

1. Field of the Invention

The present invention concerns an optoelectronic power device, the active part of which is formed by an integrated circuit combining a plurality of laser semiconductors. By analogy with integrated circuits called "sea of gates" integrated circuits, the integrated circuit according to the invention could be called a "sea of lasers" circuit. The invention also concerns a method for fabricating this integrated circuit of lasers.

2. Description of the Prior Art

Semiconductor lasers in the form of discrete elements or in arrays associating several elementary lasers are well known, but they give only little energy as compared with gas lasers or excimers for example. They are suitable for the reading of information in optical memories, or in association with optical fibers in telecommunications, but are no longer sufficient for applications requiring high power, such as industrial cutting or soldering, or medical applications.

For applications such as this, either gas lasers or solid lasers are used.

Solid lasers, as opposed to semiconductors lasers which are also in the solid state, are round sectioned or square sectioned rods, about 5 cm by 5 cm, made of materials such as YAGs (yttrium-aluminium-garnet), YLFs (yttrium-lithium-fluoride) or lithium niobate Li Nb $O_3$, all doped with neodymium for example. These rods emit a coherent light in the windows centered on 1.06, 1.55 or 2.1 $\mu$m, respectively, when they are excited by a xenon flash lamp, supplied at 1.5 kV and several tens of amperes, with a yield of 0.01%.

Not only is this yield very poor but also the xenon lamps, which are very costly, last only about 100 hours, and their supply is also very costly and bulky.

It would therefore be worthwhile to replace the flash lamp which excites a solid laser by a power semiconductor device that emits a coherent light.

SUMMARY OF THE INVENTION

The invention proposes an integrated circuit combining a plurality of elementary lasers associated, on the chip of semiconductor material, in mutually parallel arrays. These arrays are raised with respect to the surface of the substrate, in such a way that they have two cleaved faces, necessary for the operation of each elementary laser. Given that a laser emits in the axis of its Fabry-Perot cavity, two light rays are emitted, for each elementary laser, through the cleaved faces, parallel to the surface of the substrate. Two sets of mirrors, placed between the arrays of lasers, reflect the light beams at 90° and send them back perpendicularly to the surface of the substrate. Said mirrors are formed by the machining of the substrate, either in planes inclined by 45° or in half cylinders, and they are coated with at least one metallic layer used both as an optical reflector and as an electrical conductor. A first contact-making metallization is deposited on each array of lasers, and a second contact-making metallization is deposited on each reflector. Within an array, the elementary lasers are parallel supplied, between these two said metallizations, and the arrays are preferably supplied in series with respect to one another, thus simplifying the general supply of the integrated circuit of lasers: a 60 V supply at 16 A is more reliable than a 2 V supply at 500 A.

More precisely, the invention concerns an optoelectronic power device which is an emitter of coherent light given by a plurality of elementary lasers associated in strips of lasers, wherein said device is formed by an integrated circuit, supported by a substrate made of semiconductor materials of the III-V group and comprising:

at least one array with parallel, longitudinal flanks formed by epitaxial growth, on the substrate, of a plurality of layers constituting elementary lasers, the emitting strips of which are mutually parallel and perpendicular to the longitudinal flanks of the array, said flanks being micro-cleaved, so that each emitting strip produces two beams of coherent light through two cleaved faces, these beams being parallel to the plane of the substrate, at least one reflecting flat bar, parallel to the array of lasers, said flat bar being etched in relief in the substrate and having a thickness at least equal to that of the array so that the flanks of the flat bar, inclined with respect to the plane of the substrate, form reflectors that send back the beams emitted by the strips substantially perpendicularly to the plane of the substrate, said integrated circuit being complemented by at least one first metallization deposited on the array of lasers, and a second metallization for the electrical supply of the lasers formed in the array.

BRIEF DESCRIPTION OF THE DRAWINGS

The invention will be better understood from the following more detailed description of an exemplary embodiment, said description being made with reference to the appended figures, of which:

FIG. 1 is a drawing showing the structure of a prior art semiconductor laser;

FIG. 2 shows a power response curve as a function of the intensity of excitation of a laser;

FIG. 3 shows a diagram of excitation of a solid laser in rod form by a plurality of semiconductor lasers;

FIG. 4 shows a sectional view of an array of semiconductor lasers, in discrete elements, according to the prior art;

FIG. 5 shows a ¾ view in space of an assembly associating a plurality of integrated circuits of lasers, according to the invention, with a solid laser in wafer form;

FIG. 6 shows a view in space of an integrated circuit of lasers, according to the invention;

FIGS. 7 and 8 shows two sectional views of the initial semiconductor substrate, showing the embodiment of the light beam reflecting mirrors according to the invention;

FIG. 9 shows a structural drawing of the layers of semiconductor materials of an elementary laser, according to the invention, FIGS. 10 and 11 show two steps of fabrication of the cleaved faces of arrays of lasers according to the invention;

FIG. 12 shows the final step of fabrication of the cleaved faces of arrays of lasers, according to the invention.

FIG. 13 shows a ¾ view in space of a lateral face of an array according to the invention;

FIG. 14 drawing shown a plane view of the electrical supply metallizations of the lasers of an integrated circuit according to the invention.

DESCRIPTION OF PREFERRED EMBODIMENTS

A preliminary reminder of the structure and working conditions of a semiconductor laser as well as of the conditions to be achieved to obtain a power laser will enable a better understanding of the invention.

An elementary semiconductor laser, shown in FIG. 1, essentially comprises the following elements, supported on a conductive substrate 1, made of GaAs for example:
  a smoothing layer 2, for the matching of crystalline lattice parameters;
  a confinement layer 3 made of GaAlAs n
  an active layer 4, made of GaAlAs n
  a confinement layer 5, made of GaAlAs p;
  a contact-making layer 6, made of GaAs p.

Various means, schematically shown in 7, can be used to guide the electrical current which goes through the layers perpendicularly, so that only one strip 8 in the active layer 4 forms a Fabry-Perrot cavity with the two cleaved faces 9 and 10 that terminate this strip 8. A laser such as this emits a beam of coherent light in the plane of the strip 8, by its two cleaved faces 9 and 10. If a laser is integrated into an integrated circuit, it emits in parallel to a substrate and not perpendicularly like electroluminescent diodes which have no cleaved faces to form a cavity.

The guiding means 7 may be, among others:
  either two implanted pads, with very high resistance: the laser is then guided by the gain,
  or two etched grooves parallel to the strip 8: the laser is said to be one with guidance by the index.

In all cases, the response curve of a semiconductor laser as a function of the intensity of the excitation has the form shown in FIG. 2. For an intensity smaller than the threshold current $L_T$, the laser emits very weakly: all the energy is converted into heat. Beyond the threshold current, there is a light emission up to a maximum power beyond which the effects are no longer linear, and the laser may be destroyed. Lasers with quantum well structures are useful because they enable the threshold current to be reduced.

A single-strip gain-guided laser emits 10 mW of luminous power and a threshold current of 40 mA while a single-strip index-guided laser emits 40 mW of power, for a threshold current of 10 mA. It is therefore the index-guided lasers, on layers with a quantum well structure, that are chosen for making the invention.

Besides, if several elementary arrays are assembled on one chip, about 300×300 μm, it is possible to obtain 200 mW for a 500 mA current (threshold current of 250 mA) with gain-guided lasers and 200 mW for a current of 300 mA (threshold current of 100 mA) with index-guided lasers. This is all the more valuable as, in the case of an array of gain-guided lasers, the beams emitted are coupled to one another while, in the case of an array of index-guided lasers, the beams are not coupled: it is therefore possible to move the emitting strips away to distribute the calories released during operation along the array.

However, the direct application of these arrays of lasers to the excitation of a solid YAG laser, for example, is not possible.

In effect, a rod of YAG has absorption lines of between, for example, 0.78 and 0.83 μm: it is used as a converter of wavelengths, and re-emits at 1.06 μm (1.55 μm for the YLF, 2.1 μm for the Li Nb $O_3$). But the wavelength emitted by a semiconductor laser varies with the temperature. The emission line of the semiconductor must therefore be centered on the absorption line of the YAG, and this is done by means of a Peltier element, which is bulky.

Moreover, a YAG rod has at least one face covered with a deposited layer which acts as an electronic shutter, called a Q-switch. The energy emitted by the semiconductor laser collects in the rod of YAG and is released, by optical pumping, for some tens of nanoseconds when the electronic shutter opens.

Consequently, to obtain high power of excitation of the YAG rod by semiconductor lasers, a large number of array must be gathered around this rod.

FIG. 3 shows that this is technologically not feasible. Let 11 be the YAG rod, with a diameter of 5 mm and a length of 5 cm. An array 12 of lasers is fixed by a copper base 13 to a Peltier element. Along the generatrix of the rod, about 30 arrays can be positioned, that is 300 elementary lasers: it is difficult to gather more than 4 sets around a YAG rod.

The invention is based on the association of the semiconductors lasers, gathered in arrays on an integrated circuit, with a solid laser in wafer form excited, on at least one face, by a small number of integrated circuits, each one of which emits sufficient power to excite the solid laser.

FIG. 4 shows the basic component of the integrated circuit comprising one element of the invention. The component is an array 15 of semiconductor material, the different constituent layers of which, shown in detail in FIG. 9, are only cited at the reference point 16. Grooves 17, perpendicular to the large sides of this array, define emitting strips 18. This array has two cleaved faces 19 and 20 which are shown in greater detail in FIG. 13.

Arrays such as this exist in the form of separate elements, but they are restricted to a small number (10) of elementary lasers. For, it is necessary to cleave two faces for the lasers to work, and it is not possible to do the cleaving without breaking the longitudinal faces of an array which would be too long in relation to its width. This is why lasers of 10 arrays are made, having dimensions of 300×300 μm, for example.

On the contrary, if these arrays are integrated into an integrated circuit substrate, and cleaved according to the procedure which shall be described further below, it may be longer, without risk of breakage, and may group a large number of elementary lasers. But the beams emitted parallel to the substrate should be reflected to be usable.

At least one integrated circuit according to the invention, combining a plurality of arrays of semiconductor lasers, is associated on at least one main face of a solid YAG laser in wafer form, and no longer in rod form. FIG. 5 represents an association such as this.

The solid laser which should be excited by the semiconductors takes the form of a solid laser wafer 21, with dimensions of 5 cm.×5 cm. on a thickness of 5 mm, for example. This wafer is made of YAG, YLF or Li Nb $O_3$, or of other materials possessing the same properties.

Before a main or major face of the wafer 21, at least one integrated circuit 22 of semiconductor lasers is placed (there are four of them in the figure). This integrated circuit 22 is fixed to the first face of a metal base 23, made of copper for example, which acts as a thermal distributor. A Peltier effect element or module 24, fixed to the second face of the base 23, regulates the temperature of the integrated circuit or circuits 22. A receiver diode 25, placed on the base 23, measures the light received by the wafer 21, and regulates the supply current of the integrated circuit or circuits 22.

Each integrated circuit emits, perpendicularly to its substrate, twice as many light beams as it has elementary semiconductor lasers for each laser emits through its two, front and rear, cleaved faces. These beams excite the wafer 21, which absorbs them at wavelengths of between 0.78 and 0.82 $\mu$m, and re-emits a coherent beam, at a wavelength of 1.06 $\mu$m if it is made of YAG, through its lateral face 26 which is the face supporting the electronic shutter. The other lateral faces may be made reflective to have only one output beam.

In FIG. 5, the wafer 21 is moved away to reveal the organization of the integrated circuit or circuits 22. Of course, a second similar device comprising at least one integrated circuit of semiconductor lasers, may be applied against the main or major second face of the solid laser wafer 21. Eight to ten integrated circuits 22 are enough to produce the excitation that enables a solid laser to emit a pulse for some nanoseconds.

FIG. 6 shows a fragment of an integrated circuit of lasers, according to the invention. It is itself simplified to make it readable, and the details of its constitution are given in the following figures.

An integrated circuit according to the invention has a substrate 27 made of materials of the III-V group: to simplify the explanation, it will be assumed that the substrate is made of semi-insulator GaAs. In this substrate 27, reflectors 28 are etched. These reflectors 28 take the form of mutually parallel flat bars, with trapezoidal section and sides inclined by 45°, or with semicircular section. At least the flanks 29 of these flat bars are metallized, both to make them into mirrors that are plane and inclined by 45° or semi-cylindrical, and to conduct the current.

Between the reflector flat bars, there are arrays 30 of semiconductor lasers. Each array comprises a plurality of layers of semiconductor materials, referenced 16 and detailed in FIG. 9. A plurality of grooves 17 are etched by ionic machining in these layers. These grooves are parallel to one another but perpendicular to the longitudinal axis of each array 30: taken two by two, these grooves define the emitting strips 18 of each elementary laser.

Of the series of epitaxially grown layers 16, at least the first layer 40 deposited, which is doped and hence conductive, covers the semi-insulator substrate 27 on its free surface 31 and on the flanks 29 of the flat bars 28 of reflectors.

A metallization 32 runs on the free upper face of each array of lasers 30, and a short metallization 33 runs on the upper face of each flat bar 28 of reflectors: these two metallizations 32 and 33, in combination with the epitaxially grown conductive layer 40, enable the elementary lasers to be supplied with current.

Of course, the lasers can also be supplied vertically, through a substrate 27 which would be conductive: the usefulness of the substrate's being a semi-insulator will be seen further below.

The longitudinal lateral faces 34 of the arrays 30 of lasers are cleaved, so that the emitting strips 18 are between two cleaved faces forming a Fabry-Perrot cavity.

When the integrated circuit is put under voltage, each elementary laser, by its strip 18, emits a beam of coherent light 35 by a cleaved face and a beam 36 by the other cleaved face. These two beams are reflected substantially perpendicularly to the general plane of the integrated circuit by the metallized flanks 29 of the flat bars 28 of reflectors. The integrated circuit unit therefore emits a plurality of beams 35–36, parallel to one another and perpendicular to the plane of the substrate.

The description of the method of fabrication of this integrated circuit will make it possible to give details which cannot be included in a general figure such as FIG. 6.

The making of the integrated circuit according to the invention begins with the making of the flat bars 28 of reflectors. These flat bars may be etched by ionic machining, with a trapezoidal section, in a thick substrate 27 preferably made of semi-insulator GaAs, as shown in FIG. 7. The flanks 29 of these flat bars are inclined by 45° with respect to the general plane of the substrate 27. The method is known and does not have to be described in detail.

However, as shown in FIG. 8, they may be semi-cylindrical. The method is known. In a substrate 27, islets 37 are created by chemical etching. These islets are covered with a layer of masking resin 38 which is then heated: by the forces of internal tensions, the resin assumes a lenticular shape. The islets 37 are then attacked by ionic etching: the attack is stronger where the resin is thinner, and the etched islets have a substantially semi-cylindrical shape.

This second reflector shape may be advantageous: if the integrated circuit of lasers is associated with a solid YAG laser, the reflection of the light beams is more dispersed, and the solid laser is excited over a greater surface more evenly.

On the substrate 27, etched according to one of the FIGS. 7 or 8, the layers shown in FIG. 9 are then epitaxially grown:

40: GaAs n, on 2–5 $\mu$m of conductive thickness,
41: GaAlAs n, with gradual doping, barrier layer for the future chemical etching;
42: GaAs n, on 2 $\mu$ of thickness, with a view to the sub-etching;
43: GaAlAs n, first confinement layer;
44: GaAlAs n, with gradual doping;
45: GaAlAs n, quantum well in which the emissive strip 18 is formed;
46: GaAlAs p, with gradual doping;
47: GaAlAs p, second confinement layer;
48: GaAlAs p, electrical contact-making layer.

For all the layers concerned, the composition is not GaAlAs as written for the purposes of simplification, but has the form $Ga_{1-x}Al_xAs$, and it is well known that the composition varies from one layer to another: the exact composition of these layers goes beyond the scope of the invention.

This structure is close to a known structure, but an additional layer 41 of GaAlAs is introduced and the contact-making layer 48 is made of GaAlAs instead of being made, as usual, of GaAs: the reason for this is that GaAlAs is not attacked by the solution $NH_4OH + H_2O_2 + H_2O$ used for the rest of the process.

Then the grooves 17 which demarcate each emitting strip 18 by index guidance, are etched in the epitaxially grown layers, at the location of the future arrays 30 of lasers.

FIG. 10 shows the next step in fabrication. The epitaxially grown layers 40 to 48 cover the entire substrate, including the reflectors 28. It is therefore necessary to release the reflectors and the spaces 31, in order to obtain the arrays 30 of lasers.

By ionic machining, all the layers except for the two deepest layers 40 and 41, are removed from the flat bars 28 of reflectors, from their flanks 29 and from the space 31 between a flat bar 28 of reflectors and an array 30 of lasers. Each of these arrays has two longitudinal faces 49 perpendicular to the substrate, but these faces are not cleaved: hence these lasers cannot work.

To make it possible to perform a micro-cleaving operation on these faces 49, first of all they are put in an overhanging state. A solution of $NH_4OH+H_2O_2+H_2$ is used to sub-etch the GaAs layer 42 at 50, beneath the layers 43 to 48 which are all made of GaAlAs and are not attacked by the solution. The chemical attack is limited by the additional layer 41, made of GaAlAs, as shown in FIG. 11.

FIG. 12 represents a fraction of an array 30 of lasers, comprising an elementary laser, the strip 18 of which is demarcated by two grooves 17 and two non-cleaved faces 49. These faces are in an overhanging position throughout their length owing to the sub-etching at 50. To make it possible to micro-cleave them, first of all ionic machining is done to remove the parts referenced 51 to 54 which are beneath the sub-etching 50 and outside the region of each laser demarcated by the two grooves 17. Thus, on either side of the array 30 for each elementary laser, there remains a micro-beam structure 55 and 56 centered on the laser and in an overhanging position. Ultrasound is used to break these micro-beam structures 55 and 56, and the laser is then between two cleaved faces, the traces of which are at 57 and 58, substantially vertical to the bottom of the sub-etching 50: the alignment of the faces cleaved at 57 and 58 forms the lateral face 34 (FIG. 6).

The appearance of a lateral face 34 of an array 30 of lasers is shown in greater detail in FIG. 13, which gives a fuller view of the (more general) FIG. 6.

The final operation consists in the deposition of the electrical contact metallizations at 32 on the arrays 30 of lasers and at 33 on the flat bars 28 of reflectors. It is advantageous to simultaneously deposit a layer of gold on the flanks 29 of the reflectors to improve their reflectivity.

The electrical supply of a laser thus takes place from the metallization 32, through the conductive layers 48 to 42, with a return to the metallization 33 through the layers 41 and 40 which were deliberately spared on the flanks 29 of the reflectors and in the space 31.

It has been stated earlier that the supply to the elementary lasers could be done through the conductive substrate: all the lasers are then in parallel, and they have to be provided with energy of 2 V at 500 A if the integrated circuit has an optical power of 1 kW. It is more useful to provide them with series-parallel supply, with the structure that has been described. If, for example, the integrated circuit has 33 arrays with 30 lasers each, these 33 arrays are series supplied, thus enabling a voltage of 66 V to be applied. In each array, the 30 elementary lasers are parallel supplied: 15 amperes are needed. It is easier to regulate 15 A at 66 V then 500 A at 2 V, and this simplifies the metallic supply junctions.

In this case, the metallizations at the surface of the integrated circuit have the configuration shown in FIG. 14.

Each metallization 33 on a reflector 28 is connected by one or two metallizations 59–60 to the metallization 32 of the array 30 that neighbours it. The current follows the direction of the snaking arrows indicated in the figure. Leaving an array 30, it takes the direction of the layers 40 and 41 and then loops back to the metallization 33 of a reflector, from where it is reinjected into a following array by the conductors 59 and 60. The series-/parallel supply assumes that the substrate is semi-insulating.

The power integrated circuit according to the invention is used either alone, as a power semiconductor laser, or in association with a solid laser. Depending on number of circuits associated, the energy produced is between 1 optical kW for a single integrated circuit and some tens of kW for several associated circuits. The energy is pulsed for some tens of nanoseconds, at a frequency of some tens of Hertz. It is used in surgery, in the cutting of materials and in soldering.

What is claimed is:

1. An optoelectronic power device for emitting coherent light generated by a plurality of elementary lasers associated in strips of lasers, said device being formed of an integrated circuit, supported by a substrate made of semiconductor materials, and comprising:
    at least one array of elementary semiconductor lasers having parallel, longitudinal flanks and formed by epitaxial growth on the substrate,
    a plurality of layers, including an emitting strip for emitting a beam of coherent light in a plane thereof, constituting each of the elementary lasers, each of the emitting strips being mutually parallel and extending perpendicular to the parallel, longitudinal flanks of the array of lasers and producing two beams of coherent light at each end thereof, the beams being parallel to a plane of the substrate, and
    at least one reflecting bar, parallel to the array of lasers and adjacent at least one end of each of the emitting strips, said bar being etches in relief in the substrate to provide the at least one reflecting bar with inclined, longitudinal flanks and having a height at least equal to that of the array so that the flanks of the reflecting bar from reflectors that reflect the beams, emitted by the strips, substantially perpendicularly to the plane of the substrate,
    wherein said integrated circuit is complemented by at least one first metallization deposited on the array of lasers, and a second metallization for electrical supply of the lasers of the array, and
    wherein the at least one reflecting bar has, perpendicularly to a longitudinal axis thereof, a substantially semi-circular section, a semi-circular surface thereof forming the inclined flanks of the at least one reflecting bar and being metallized by a metallization to increase reflectivity.

2. A device according to claim 1, wherein the elementary lasers are of the index-guided, quantum well type, the array being etched, for each elementary laser, by two grooves which define the emitting strip and are perpendicular to the longitudinal flanks of the array of lasers.

3. A device according to claim 1, wherein, among the plurality of layers epitaxially grown on the substrate, first and third layers thereof, from the substrate, are made of a first type of material capable of being attacked by a chemical solution, all other layers being made of a second type of material which cannot be attacked by said chemical solutions.

4. A device according to claim 3, wherein the first layer and a second layer are on the order of 2-5 μm thick and cover a space located between the array of lasers and the at least one reflecting bar and the bar itself, said first and second layers forming an electrical conductor on which the second metallization is deposited, on the flat bar of reflectors.

5. A device according to claim 1 wherein more than one at least one array and reflecting bar are provide one the substrate, wherein the substrate is made of semi-insulator materials and is both series supplied and parallel supplied, all the elementary lasers of one and the same array being parallel supplied, and all the arrays being series supplied, the metallization deposited on each array of lasers being connected by at least one conductor to the metallization deposited on a reflecting bar adjacent said associated array of lasers, the electrical supply being applied between first and last metallizations on the integrated circuit.

6. A device according to claim 1, wherein more than one at least one array and reflecting bar are provided, wherein the substrate is made of conductive materials, all the elementary lasers of the integrated circuit are parallel supplied, all metallizations deposited on the arrays of lasers being connected to a first supply terminal, and all metallizations deposited on reflecting bars being connected to a second supply terminal.

7. An optoelectronic power device which is an emitter of coherent light, comprising:
   a solid laser, in wafer form, having a major and a lateral face,
   at least one integrated circuit of lasers for emitting coherent light generated by a plurality of elementary lasers associated in strips of lasers, said integrated circuit being supported by a substrate made of semiconductor materials of the III-V group, and including:
   at least one array of elementary semiconductor lasers having parallel, longitudinal flanks and formed by epitaxial growth on the substrate,
   a plurality of layers, including an emitting strip for emitting a beam of coherent light in a plane thereof, constituting each of the elementary lasers, each of the emitting strips being mutually parallel and extending perpendicular to the parallel, longitudinal flanks of the array of lasers and producing two beams of coherent light at each end thereof, the beams being parallel to a plane of the substrate, and
   at least one reflecting bar, parallel to the array of lasers and adjacent at least one end of each of the emitting strips, said bar being etched in relief in the substrate to provide the at least one reflecting bar with inclined, longitudinal flanks and having a height at least equal to that of the array so that the flanks of the reflecting bar form reflectors that reflect the beams, emitted by the strips, substantially perpendicularly to the plane of the substrate,
   wherein said integrated circuit is complemented by at least one first metallization deposited on the array of lasers, and a second metallization for electrical supply of the lasers of the array,
   wherein the at least one reflecting bar has, perpendicularly to a longitudinal axis thereof, a substantially semi-circular section, a semi-circular surface thereof forming the inclined flanks of the at least one reflecting bar and being metallized by a metallization to increase reflectivity,
   wherein the at least one integrated circuit of lasers is juxtaposed to the major face of the solid laser in wafer form,
   wherein said integrated circuit is regulated in temperature by a metallic base and a Peltier effect module,
   wherein current to said integrated circuit is regulated by a regulation diode, and
   wherein said integrated circuit excites the solid laser which, through the lateral face, emits a high-power beam of pulsed coherent light.

8. A method for making an optoelectronic power device comprising the steps of:
   (a) from a substrate made of semiconductor materials of the III-V group, etching, by ionic machining, at least one flat bar which form a reflector, the at least one bar including a section having one of flanks inclined by 45° and a semi-cylindrical section;
   (b) on a free surface of the substrate and of the flat bars of reflectors, depositing, by epitaxy:
      a first, conductive, thick layer made of a first type of material adapted to that of the substrate;
      a second layer, with gradual doping, made of a second type of material which cannot be attacked by a chemical solution which attacks the first type of material;
      a third layer, made of a first type of material;
      a plurality of layers constituting at least one array of elementary lasers, these plurality of layers being made of a material of the second type, which cannot be attacked by a chemical solution;
   (c) etching, in the epitaxially grown layers, grooves which demarcate, for each elementary laser of the at least one array, an emitting strip, by index guidance;
   (d) removing, by ionic etching, the epitaxially grown layers, except for the first two layers deposited, so as to isolate the at least one array of lasers;
   (e) sub-etching, by a solution of $NH_4OH + H_2O_2 + H_2O$ of a third solution, while the second layer, made of a material that cannot be attacked, constitutes a barrier to the sub-etching which places longitudinal faces of the at least one array of lasers in an overhanging position.
   (f) removing, ionic etching, parts of the at least one array of lasers that are in an overhanging position and are located outside a region of each elementary laser demarcated by two grooves,
   (g) cleaving, by ultrasound, parts of each elementary laser remaining in an overhanging position after the step f, so as to provide each laser with two faces;
   (h) depositing electrical contact metallizations, including one metallization on the at least one array of lasers and one metallization on the at least one flat bar, the flanks of said at least one flat bar being also metallized to increase reflectivity.

* * * * *